(12) United States Patent
Yu et al.

(10) Patent No.: US 7,518,192 B2
(45) Date of Patent: Apr. 14, 2009

(54) ASYMMETRICAL LAYOUT STRUCTURE FOR ESD PROTECTION

(75) Inventors: Kuo-Feng Yu, Hsinchu (TW); Jian-Hsing Lee, Hsin-Chu (TW); Jiaw-Ren Shih, Hsinchu (TW); Fu Chin Yang, Fengshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/985,532

(22) Filed: Nov. 10, 2004

(65) Prior Publication Data

US 2006/0097330 A1     May 11, 2006

(51) Int. Cl.
    *H01L 23/62*     (2006.01)
(52) U.S. Cl. .............................. 257/356; 257/E23.145; 257/E23.151; 438/666
(58) Field of Classification Search ................ 257/356, 257/775, 919, 920, 23.141, E23.145, E23.151, 257/E21.59; 438/666, 98
See application file for complete search history.

(56) References Cited

U.S. PATENT DOCUMENTS

| | | | | |
|---|---|---|---|---|
| 5,338,986 A * | 8/1994 | Kurimoto | .................... | 327/566 |
| 5,451,799 A * | 9/1995 | Kurimoto et al. | ........... | 257/174 |
| 5,459,345 A * | 10/1995 | Okudaira et al. | ............ | 257/310 |
| 5,623,159 A | 4/1997 | Monk et al. | | |
| 5,721,445 A * | 2/1998 | Singh et al. | .................. | 257/369 |
| 5,728,594 A * | 3/1998 | Efland et al. | ................ | 438/128 |
| 5,789,791 A * | 8/1998 | Bergemont | ................. | 257/401 |
| 5,793,093 A | 8/1998 | Warwick | | |
| 5,801,091 A * | 9/1998 | Efland et al. | ................ | 438/622 |
| 5,831,219 A * | 11/1998 | Kobayashi et al. | .......... | 174/261 |
| 5,831,316 A * | 11/1998 | Yu et al. | ..................... | 257/401 |
| 5,903,030 A * | 5/1999 | Kim | ........................... | 257/355 |
| 5,910,677 A * | 6/1999 | Irino | .......................... | 257/393 |
| 5,955,781 A * | 9/1999 | Joshi et al. | ................... | 257/712 |
| 5,990,504 A * | 11/1999 | Morifuji | ..................... | 257/270 |
| 6,028,338 A * | 2/2000 | Saito et al. | ................... | 257/360 |
| 6,034,552 A * | 3/2000 | Chang et al. | .................. | 326/83 |
| 6,236,073 B1 * | 5/2001 | Hsu | ........................... | 257/213 |
| 6,388,850 B1 | 5/2002 | Ker et al. | | |
| 6,462,384 B2 * | 10/2002 | Kwon | ......................... | 257/360 |
| 6,483,045 B1 * | 11/2002 | Wang et al. | ................. | 174/264 |
| 6,489,689 B2 * | 12/2002 | Nojiri | ......................... | 257/786 |
| RE38,319 E * | 11/2003 | Lin et al. | ..................... | 327/313 |
| 6,660,618 B1 * | 12/2003 | Chen et al. | .................. | 438/584 |

(Continued)

OTHER PUBLICATIONS

Radhakrishnan, M.K., et al., "ESD Reliability Issues in RF CMOS Circuits," http://www.imec.be/wwwinter/processing/try/Natarajan2001.pdf.

*Primary Examiner*—Lex Malsawma
*Assistant Examiner*—William F Kraig
(74) *Attorney, Agent, or Firm*—Slater & Matsil, L.L.P.

(57) ABSTRACT

A semiconductor structure for electrostatic discharge protection is presented. The semiconductor structure comprises a grounded gate nMOS (GGNMOS) having a substrate, a gate electrode, a source region and a drain region. A plurality of contact plugs is formed on the source and drain side. A plurality of first level vias is electrically coupled to the GGNMOS and has a substantially asymmetrical layout in the source and drain regions. A second level via(s) re-routes the ESD current to the desired first level vias. The uniformity of the current flow in the GGNMOS is improved.

33 Claims, 7 Drawing Sheets

U.S. PATENT DOCUMENTS

| | | | |
|---|---|---|---|
| 6,713,820 B2 * | 3/2004 | Omi et al. | 257/382 |
| 6,724,677 B1 | 4/2004 | Su et al. | |
| 6,744,107 B1 | 6/2004 | Ker et al. | |
| 6,747,307 B1 * | 6/2004 | Vathulya et al. | 257/307 |
| 6,873,017 B2 * | 3/2005 | Cai et al. | 257/355 |
| 6,914,305 B2 * | 7/2005 | Kwon et al. | 257/361 |
| 7,112,855 B2 * | 9/2006 | Fong | 257/382 |
| 7,209,333 B2 * | 4/2007 | Lee et al. | 361/90 |
| 2001/0033024 A1 * | 10/2001 | Fraser et al. | 257/758 |
| 2002/0000668 A1 * | 1/2002 | Sakihama et al. | 257/758 |
| 2002/0033504 A1 * | 3/2002 | Ohnakado | 257/350 |
| 2002/0130367 A1 * | 9/2002 | Cabral et al. | 257/368 |
| 2003/0218841 A1 * | 11/2003 | Kodama | 361/56 |
| 2004/0125520 A1 * | 7/2004 | McGruer et al. | 361/56 |
| 2004/0178454 A1 * | 9/2004 | Kuroda et al. | 257/360 |
| 2005/0093163 A1 * | 5/2005 | Ho et al. | 257/762 |
| 2005/0098830 A1 * | 5/2005 | Honjoh et al. | 257/355 |
| 2005/0173806 A1 * | 8/2005 | Matsubara | 257/774 |

* cited by examiner

ASYMMETRICAL LAYOUT STRUCTURE FOR ESD PROTECTION

TECHNICAL FIELD

This invention relates generally to electrostatic discharge devices, and more specifically to obtaining uniformity of current flow in a grounded gate nMOS.

BACKGROUND

Electrostatic discharge (ESD) is a phenomenon where electrostatic charges migrate from a non-conductive surface via a conductive material. Since an electrostatic voltage is usually quite high, the ESD can easily damage the substrate and other components of an integrated circuit. For example, an electrostatic voltage from hundreds to thousands of volts can be created on a human body walking on a carpet under a higher relative humidity, while more than 10,000 volts can be created under a lower relative humidity. Also, an electrostatic voltage from hundreds to thousands of volts can be created in machines for packaging or testing integrated circuits. Therefore, when a human body or a machine carrying electrostatic charges contacts a chip, a large transient ESD current is generated, damaging or destroying the integrated circuits on the chip.

To protect the integrated circuits from being damaged by ESD, ESD devices capable of conducting an ESD current to ground are incorporated into the integrated circuits. Grounded gate NMOS (GGNMOS) devices are commonly used in protecting circuits.

Figure 1:
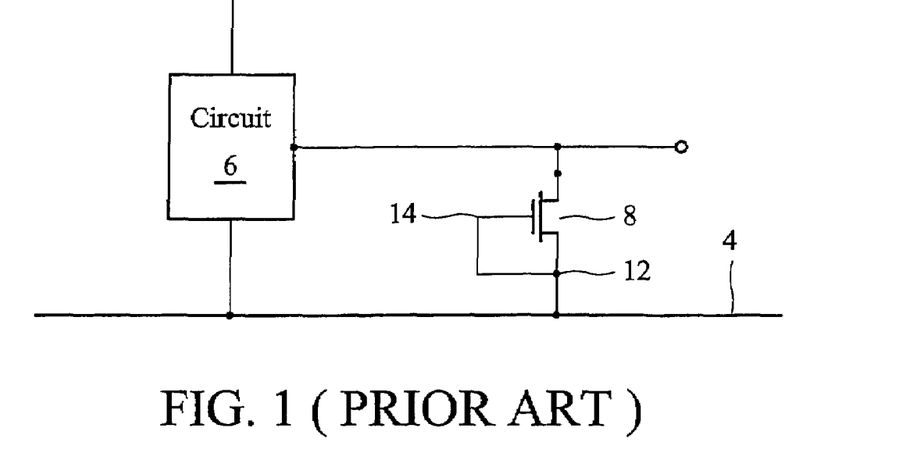
FIG. 1 illustrates a typical electrostatic discharge protection circuit using a grounded gate NMOS (GGNMOS)

A typical GGNMOS ESD protection circuit is illustrated in FIG. 1. The ESD protection circuit includes a GGNMOS 8 for protecting the circuit 6. The gate 14 and source 12 of the GGNMOS 8 are coupled to the power line $V_{SS}$ 4, where $V_{SS}$ is typically grounded. Under normal operation, GGNMOS 8 is turned off so that it does not affect circuit 6. When an ESD transient occurs to the circuit 6, the GGNMOS 8 is turned on, and the ESD current is conducted to $V_{SS}$ 4. In order to conduct a high ESD current, the GGNMOS 8 typically has a great device dimension, such as W/L=500/0.5 in a typical 0.35μ CMOS technology. With such a device dimension, the GGNMOS 8 typically has a multiple-finger poly gate. It has been found that a GGNMOS with a large layout area and a great device dimension may only sustain a low ESD current because all portions of the GGNMOS cannot be uniformly turned-on during the ESD stress. Only a portion of the large-dimension GGNMOS is turned on to bypass the ESD current, but most of the portions stay off during the ESD stress.

Figure 2:
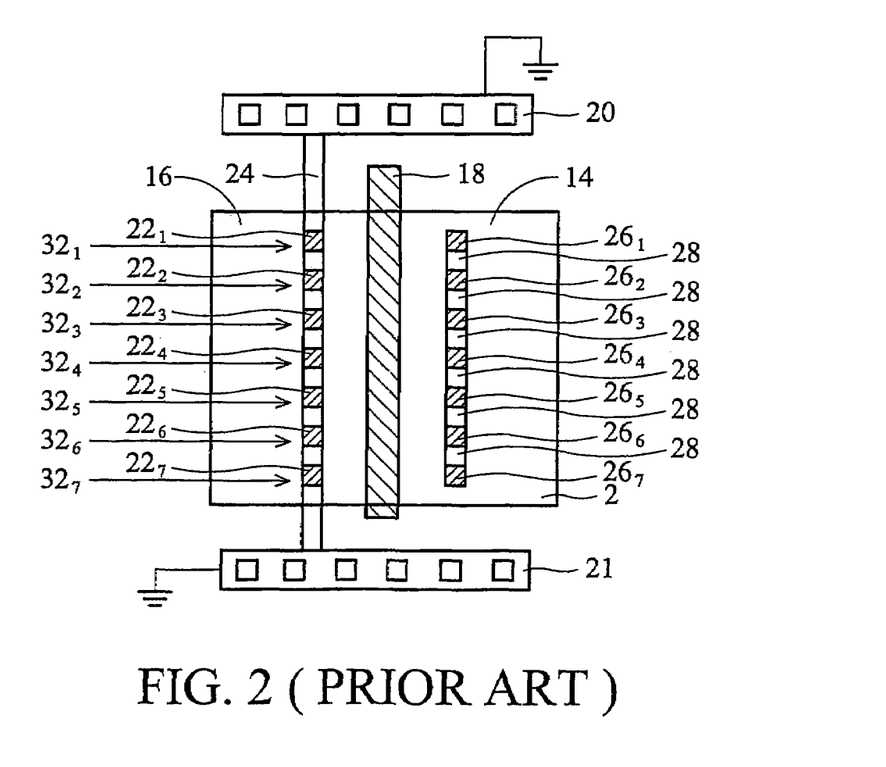
FIG. 2 illustrates a top view of one finger of a conventional GGNMOS.

FIG. 2 illustrates a top view of a conventional GGNMOS. Only one finger is shown with a gate electrode 18, a drain region 14 and a source region 16. Contact plugs $26_1$ through $26_7$ connect to the drain region 14. A metal line 28 connects drain side contact plugs $26_1$ through $26_7$ to the circuit being protected. Contact plugs $22_1$ through $22_7$ connect to the source region 16. A metal line 24 couples contact plugs $22_1$ through $22_7$ to the p-well pick-up regions 20 and 21 that are located at the ends of the gate electrode 18. P-well pick-up regions 20 and 21 are typically grounded.

Multiple contact plugs divide the source region 14 and drain region 16 into sub regions. For simplicity purposes, each sub drain region and sub source region is referred to as the contact plug number next to it. The GGNMOS can be treated as sub NMOS transistors $32_1$ through $32_7$ connected in parallel. Each sub NMOS transistor $32_1$ through $32_7$ is formed of a drain $26_1$ through $26_7$, a gate electrode 18 and a source $22_1$ through $22_7$, respectively. When an ESD current occurs, it first flows from metal line 28 to contact plugs $26_1$ through $26_7$, then to the sub transistors $32_1$ through $32_7$ that are turned on. The ESD current then goes through contact plugs $22_1$ through $22_7$, then to metal 24, and finally to p-well pick-up regions 20 and 21. It is to be noted that besides the current flowing from the drain to the source of each transistor, there is also a substrate current flowing at a direction from sub transistor $32_4$ to transistors $32_5$, $32_6$ and $32_7$, and a substrate current flowing at a direction from sub transistor $32_4$ to transistors $32_3$, $32_2$ and $32_1$.

Figure 3:
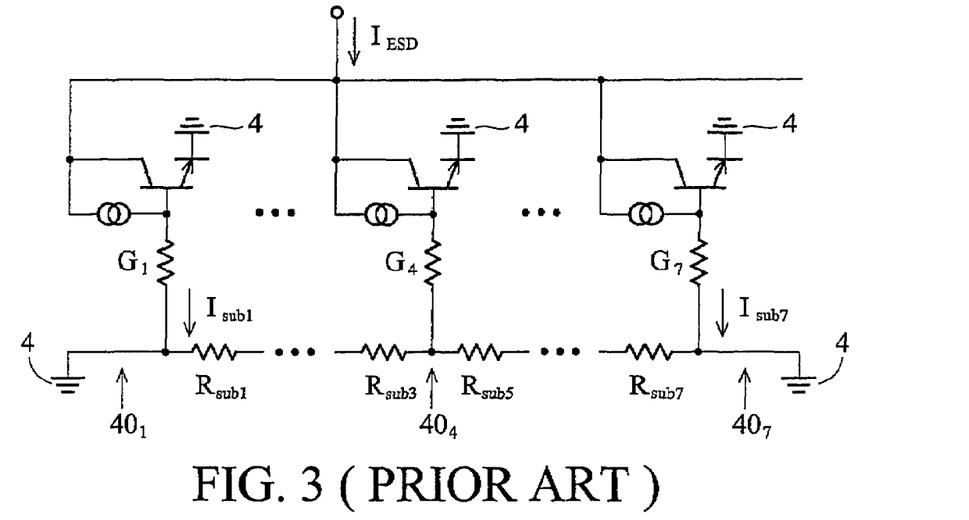
FIG. 3 illustrates a transmission-line model for a conventional GGNMOS.

FIG. 3 illustrates a transmission-line model for the GGNMOS shown in FIG. 2. Each of the sub transistors $32_1$ through $32_7$ illustrated in FIG. 2 is modeled by an equivalent circuit $40_1$ through $40_7$. Circuits $40_1$ through $40_7$ are coupled in parallel. The equivalent circuit of the GGNMOS has an n-p-n structure, which is formed of drain(n)-substrate(p)-source(n). The resistors $G_1$ through $G_7$ are the substrate resistance of vertical path (from the top channel between the source 14 and drain 16 to the deep substrate, i.e., direction from gate to substrate or direction which penetrates into paper). Resistors $R_{sub1}$ through $R_{sub7}$ are the lateral substrate resistance from the deep substrate to the p-well pick-up regions. When an ESD current $I_{ESD}$ occurs, it is distributed to circuits $40_1$ through $40_7$ and sunk to ground at node 4. As discussed in FIG. 2, the ESD current $I_{ESD}$ also goes through substrate resistors $R_{sub3}$, $R_{sub2}$ and $R_{sub1}$ to ground at node 4. It is appreciated that sub transistor $32_4$ has the highest substrate resistance since it is furthest from the ESD sink point 4. The substrate resistances induce a voltage drop on the substrate 2. Therefore, the sub transistor $32_4$ is likely to be turned on earlier than any other transistor. Similar analysis reveals that transistors in the center are more likely to be turned on earlier than transistors at the ends.

Turning on sub transistors at different times causes current crowding. At a lower ESD current, only sub transistors in the center, such as transistors $32_4$, $32_3$ and $32_5$ are turned on. When current increases, from the center to the end, more and more sub transistors are turned on until at a certain time all sub transistors are turned on. It is noted that even when all the sub transistors are on, the center transistors carry more ESD current than the transistors at the ends so that they are more prone to damage.

In order to improve the ESD level of such a large dimension GGNMOS, the multiple fingers of the large dimension GGNMOS have to be uniformly triggered on to share ESD current. If all the fingers and the sub transistors of the large dimension GGNMOS can be uniformly turned on during the ESD stress condition, the GGNMOS can sustain a much higher ESD level. Therefore, there is the need to achieve uniformity among the multiple sub transistors of the large-dimension GGNMOS.

SUMMARY OF THE INVENTION

The preferred embodiment of the present invention presents a semiconductor structure for electrostatic discharge protection.

In accordance with one aspect of the present invention, the semiconductor structure comprises a grounded gate nMOS (GGNMOS) having a substrate, a gate electrode, a source region and a drain region. A plurality of contact plugs is formed on the source and drain side. A plurality of first level vias is electrically coupled to the GGNMOS and has a substantially asymmetrical layout in the source and drain regions. A second level via(s) re-routes the ESD current to the desired first level vias.

The present invention provides a novel structure and method to improve the uniformity of a GGNMOS. By making the sub transistors turn on more uniformly, the preferred embodiment of the present invention makes the ESD protection circuit more efficient. This in turn improves the breakdown current and voltages, and the GGNMOS can be made smaller, therefore saving layout space without sacrificing protection ability.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 4:
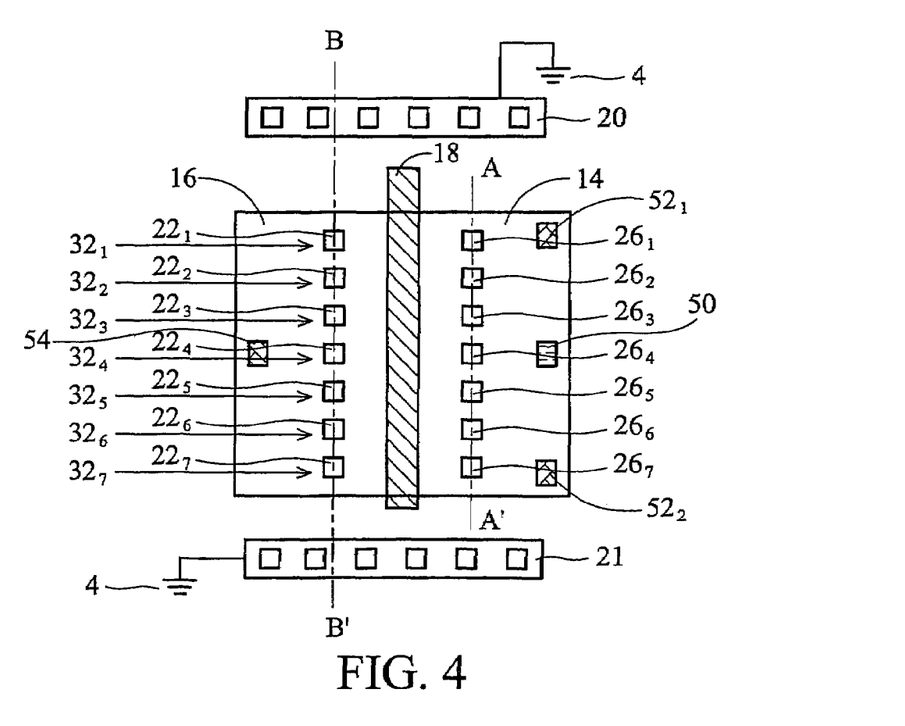
FIG. 4 illustrates a top view of a preferred embodiment of the present invention.
Figure 5:
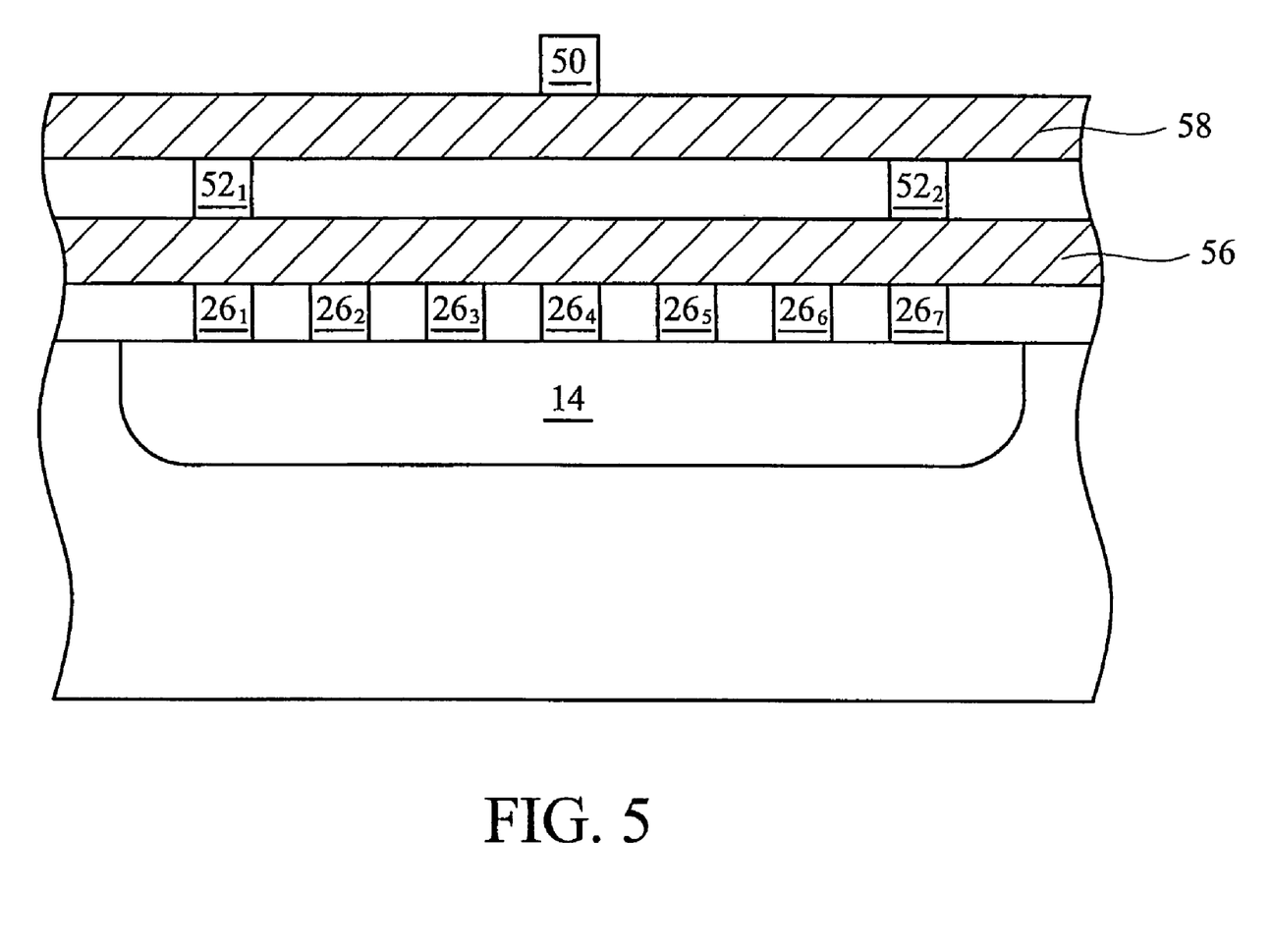
FIG. 5 illustrates a cross-sectional view of the preferred embodiment along line A-A' in FIG. 4.
Figure 6:
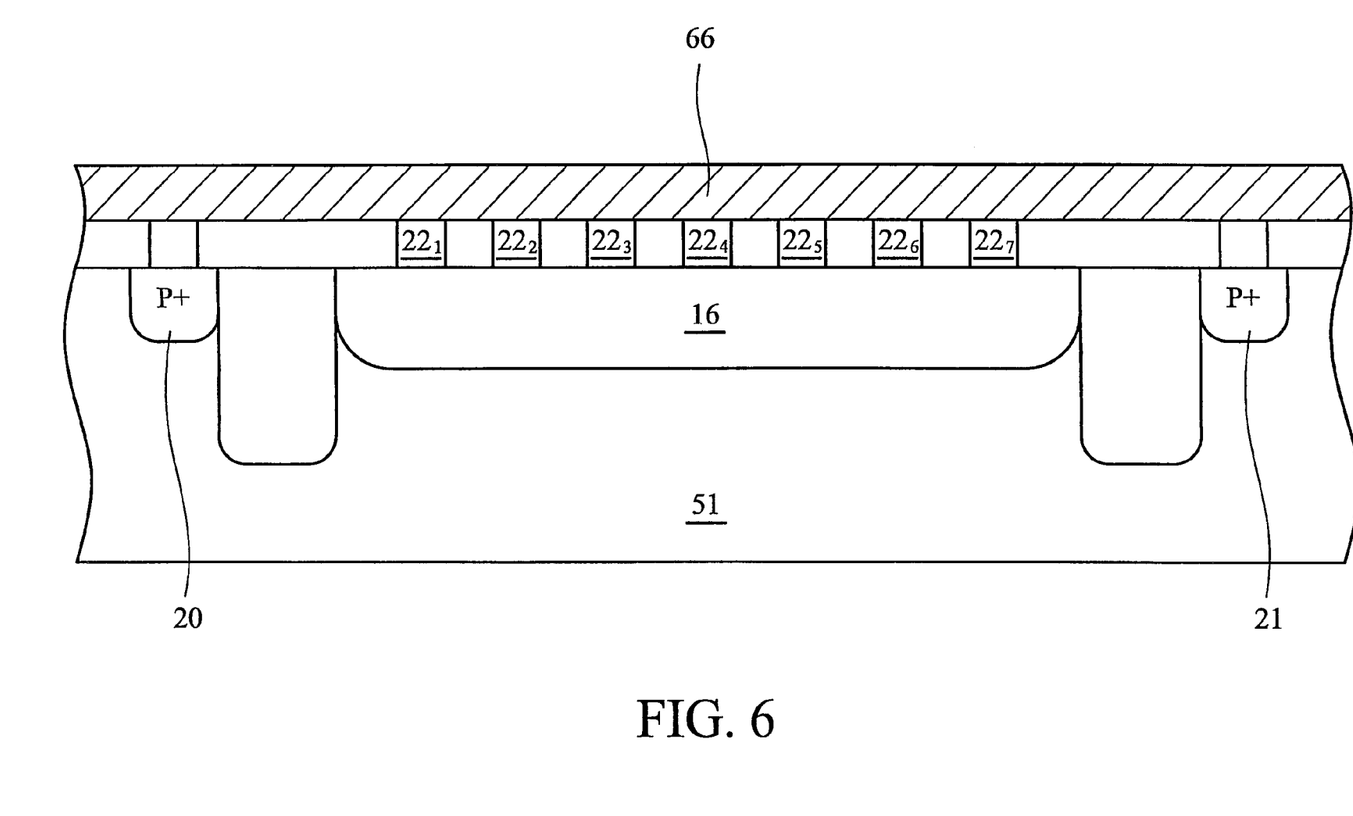
FIG. 6 illustrates a cross-sectional view of the preferred embodiment along line B-B' in FIG. 4.

The preferred embodiments are illustrated in FIGS. 4 through 9 wherein like reference numbers are used to designate like elements throughout the various views and illustrative embodiments of the present invention. FIGS. 4, 5 and 6 illustrate different views of the preferred embodiment. FIG. 4 illustrates a top view. A gate dielectric is formed on a substrate. A gate electrode 18 is formed on the gate dielectric with a preferred length of about 0.06 μm to 0.4 μm and a preferred width of about 1 μm to about 90 μm. More preferably, the gate length is between 0.1 μm to 0.3 μm and the gate width is between about 10 μm to about 60 μm. The gate electrode 18 is preferably coupled to at least one of the pick-up regions 20 and 21 located at two ends of the gate electrode 18. More preferably, the gate electrode 18 is coupled to both pick-up regions 20 and 21 for a better grounding. The pick-up regions 20 and 21 are preferably doped-well pick-up regions. Preferably, the pick-up regions 20 and 21 are grounded and each comprises at least 3 connection points such as vias connecting ground potentials. In FIG. 4, there are 6 connection points connecting ground potentials on each of the pick-up regions 20 and 21. In the preferred embodiment, the pick-up regions 20 and 21 are p-well pickup regions and they will be referred to as p-well pick-up regions 20 and 21. In other embodiments, they are n-well pick-up regions. The details of forming the gate electrode 18, drain region 14, source region 16, and doped pick-up regions 20 and 21 are well known in the art so that they are not repeated herein.

The present invention is related to an asymmetrical layout of openings on drain and source sides of a GGNMOS device for improving ESD performance. The asymmetrical layout of openings may be contact plugs, via openings or trench openings, where in each case, the openings are filled with conductive materials. A preferred embodiment is described in FIGS. 4, 5 and 6. As shown in FIG. 4, contact plugs $26_1$ through $26_7$ are coupled to the drain region 14. First level vias $52_1$ and $52_2$ are coupled to the drain side contact plugs $26_1$ through $26_7$ by a first level metal 56 (not shown). A second level via 50 couples the device being protected to two first level vias $52_1$ and $52_2$ through a second level metal 58 (not shown). Source contact plugs $22_1$ through $22_7$ are coupled to a via 54 located close to the middle of the gate. Via 54 is coupled to the p-well pick-up regions 20 and 21. The dimension of the vias is typically related to the technology. For example, in 0.13 μm technology, a first level or a second level via preferably has a length and a width of about 0.05 μm to about 0.5 μm. In the preferred embodiment, the vias 50, $52_1$, $52_2$ and 54 are formed by a well-known damascene process. In other embodiments, vias can be formed using a plug process.

In order to explain the structure of the preferred embodiment in detail, cross-sectional views of FIG. 4 are illustrated in FIGS. 5 and 6. FIG. 5 illustrates a cross-sectional view of the preferred embodiment along line A-A' in FIG. 4. For simplicity purposes, the contact plugs $26_1$ through $26_7$, and the vias $52_1$, $52_2$ and 50 are shown as in one plan. One skilled in the art will recognize that they can be in different plans as shown in FIG. 4. Multiple drain side contact plugs $26_1$ through $26_7$ couple the drain 14 of the GGNMOS to a first level metal 56. The width of the first level metal 56 is preferably about 0.4 μm to 3 μm. Typically the contact plugs $26_1$ through $26_7$ are distributed evenly. Two first level vias $52_1$ and $52_2$ located at the ends of the drain region 14 connect the first level metal 56 to a second level metal 58. The second level metal 58 is then connected to a second level via 50 that is coupled to the circuit being protected. Due to the large current that the GGNMOS may have to sink, it is desired that each of the vias 50, $52_1$ and $52_2$ comprise a group of vias. It is preferred that both the first level vias 52 comprise at least 2 vias on the drain side. Preferably, the number of first level vias 52 is higher than the number of second level vias 50. In one embodiment, the first level vias comprise two vias located on each end of the drain side and the second level vias comprise one via on the middle of the drain side, as shown in FIG. 5. More preferably, for ESD performance, the $1^{st}$ and $2^{nd}$ level vias may each comprise at least three vias on the drain side. The embodiment referred to in FIG. 4 comprises two first level vias and one second level via, but ESD performance can be improved if more vias, for example, more than three, are put on the drain side for the first and second levels.

FIG. 6 illustrates a cross sectional view of the preferred embodiment along line B-B' in FIG. 4, which is on the source side. Multiple drain contact plugs $22_1$ through $22_7$ couple the source 16 of the GGNMOS to a metal line 66. Metal line 66 is preferably a first level metal although it can be formed at the same time as other levels on the drain side, such as the first level metal 56. There are also first level vias 54 coupled to the first level metal 66, a second level metal (not shown) coupled to the first level vias 54 and second level vias (not shown) coupled to the second level metal. The metal line 66 is coupled to p-well pick-up regions 20 and 21. It is preferred that the first level vias comprise at least one via on the source side. In one embodiment, the first level vias comprise a via on the middle of the source side. More preferably, to improve ESD performance, the first level vias comprises at least two vias on the source side. In the preferred embodiment of the present invention, to improve ESD performance, the number of vias comprised by the first level vias are asymmetrical on drain and source sides. The asymmetrical layout of vias on the source and drain sides are also preferred for the second level vias. Also, the number of vias on the drain side are preferably more than the number of vias on the source side at the same level.

Compared to the prior art in FIG. 2, the ESD current path is re-arranged by routing the ESD current to two vias $52_1$ and $52_2$ at two ends of the drain. The ESD current flows in metal 56 from vias $52_1$ and $52_2$ to sub transistors $32_1$ through $32_7$. Since the resistance of a metal line is proportional to the length of the metal line, the resistance in metal line 56 for transistors $32_1$ and $32_7$ are the lowest since they are closest to vias $52_1$ and $52_2$. The metal 56 resistance increases for transistors $32_2$, $32_3$ and $32_4$ due to the metal line resistance between contact plugs $22_1$ and $22_2$, and $22_3$ and $22_4$. From transistor $32_7$ to transistor $32_4$, metal 56 resistances also increase. Lower metal 56 resistance causes the sub transistors $32_1$ and $32_7$ to more likely be turned on first because current flow has high possibility to flow through a lower resistance path. This counteracts the effect discussed in the prior art where the center resistors are turned on first. Therefore, the preferred embodiment of the present invention has a more uniform turn-on voltage.

Also, there is another effect that possibly contributes to the uniformity of the turn on voltages, although it has less effect than the one discussed in the previous paragraph. In FIG. 4, the sub transistor $32_1$ has a relatively low drain substrate resistance because its drain is close to the via $52_1$. It has a relatively high source substrate resistance because the contact plug $22_1$ is far away from the via 54. Conversely, the transistor $32_4$ has a relatively high drain substrate resistance because its drain $26_4$ is far away from the via $52_1$, while it has a relatively low source substrate resistance because the contact plug $22_4$ is close to the via 54. The transistors $32_2$ and $32_3$ have moderate drain substrate resistance and source substrate resistance. The combination of drain substrate resistance and source substrate resistance for transistors $32_1$, $32_2$, $32_3$ and $32_4$ are close, thus the voltage drops induced are close. Similar conclusions can be drawn for sub transistors $32_5$, $32_6$, $32_7$. Therefore, re-arranging the discharging current going into the drain of the GGNMOS has reduced the non-uniformity caused by the substrate resistance.

Figure 7:
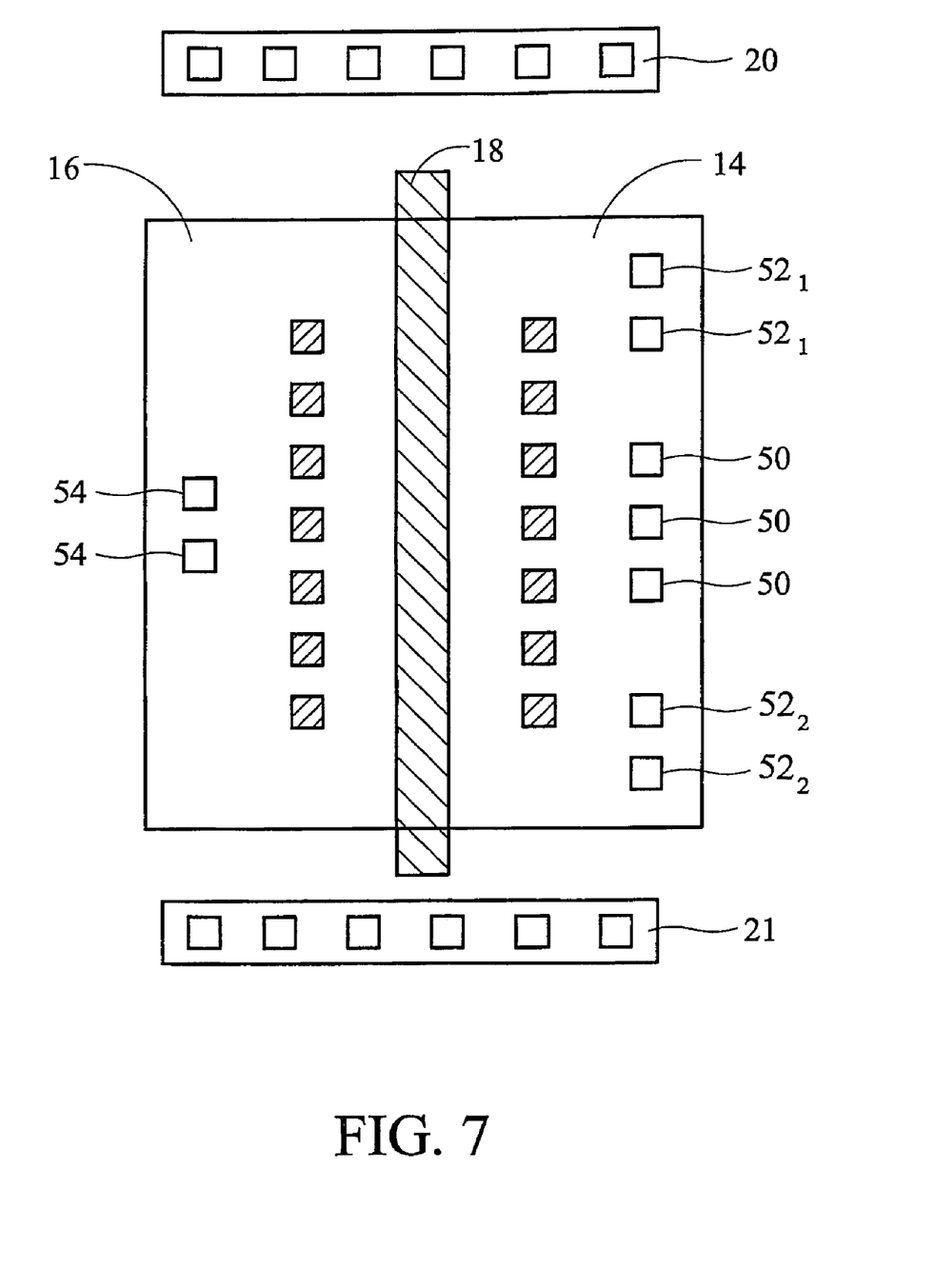
FIG. 7 illustrates a variation of the preferred embodiment having via groups.

FIG. 7 illustrates a variation of the preferred embodiment. If the potential ESD current is high, or the via numbers in one finger is great, then vias 50, $52_1$, $52_2$ and 54 can be via groups having multiple vias. The number of vias depends on how much current each via can safely conduct.

Figure 8A:
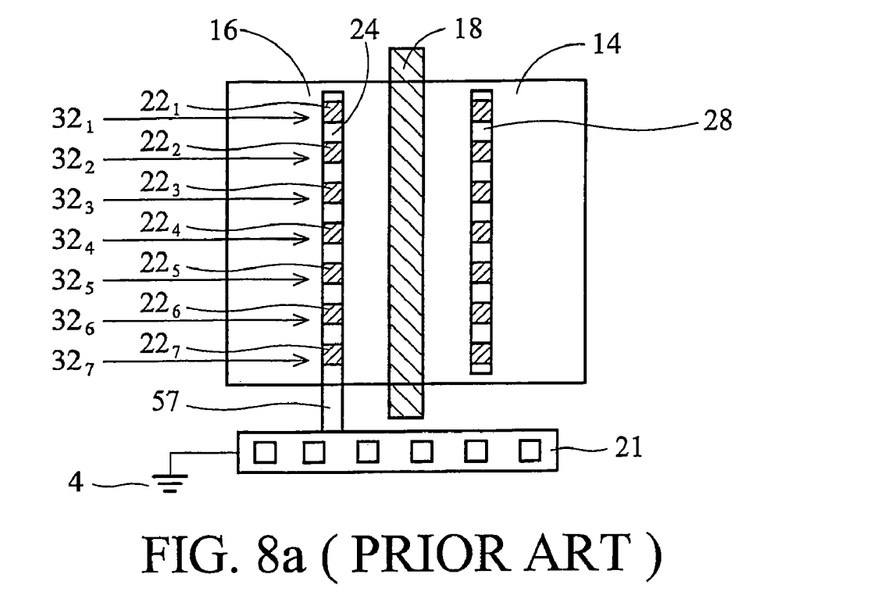
FIG. 8a illustrates a prior art GGNMOS having one p-well pick-up region.
Figure 8B:
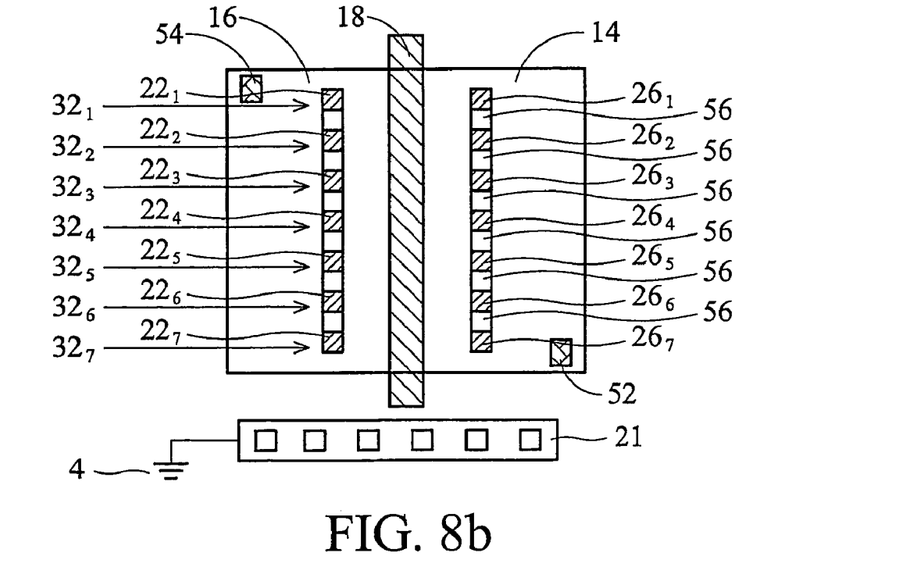
FIG. 8b illustrates an embodiment of the present invention having one p-well pick-up region.

FIG. 8a illustrates another prior art. If there is only one p-well pick-up region 21 coupled to the source side contact plugs $22_1$ through $22_7$ through a metal line 57, the sub transistor $32_1$ has the highest substrate resistance since it is furthest from the ground 4, and it will be turned on first. The ESD current crowding effect causes the transistor $32_1$ to be more prone to failure. To counteract this effect, a drain side via 52 is placed nearest the contact plug $26_7$ and is connected to contact plugs $26_1$ through $26_7$ through a metal 56, as shown in FIG. 8b. A source side via 54 is placed nearest contact plug $22_1$. The source side contact plugs $22_1$ through $22_7$ are coupled to via 54 through a metal, then to the p-well pick-up region 21. The sub transistor $32_7$ has the lowest metal 56 resistance causing it to be turned on first. This counteracts the substrate resistance effect, therefore the transistors $32_1$ through $32_7$ are turned on more uniformly.

In a typical layout of the GGNMOS using the present invention, the GGNMOS has multiple fingers. For a layout using 0.13 µm technology, in order to sink an ESD current of about one to two amps at human body mode (HMB), a GGNMOS preferably has a total length of about 720 µm and a width of a little greater than about 30 µm. Each gate has a preferred length of about 0.2 µm and a preferred width of about 30 µm. The source and drain regions on each gate are within an active region in the substrate. The active region has a preferred length of about 1 µm to about 10 µm, and more preferably about 1 µm to about 3 µm. The active region has a preferred width of about 10 µm to about 100 µm, and more preferably about 10 µm to about 30 µm.

Since the ESD current is distributed to multiple fingers, the more fingers the GGNMOS has, the less ESD current each finger needs to carry, hence less first level vias 52 are needed. For example, if a GGNMOS has 15 fingers, for each finger, two first level vias 52 are typically enough. Also since the ESD current is distributed to the vias, the more vias a GGNMOS has, the less ESD current one via needs to carry. Typically, for 0.13 µm technology, 32 vias on each of the source and drain sides are enough for discharging the ESD current.

Figure 9:
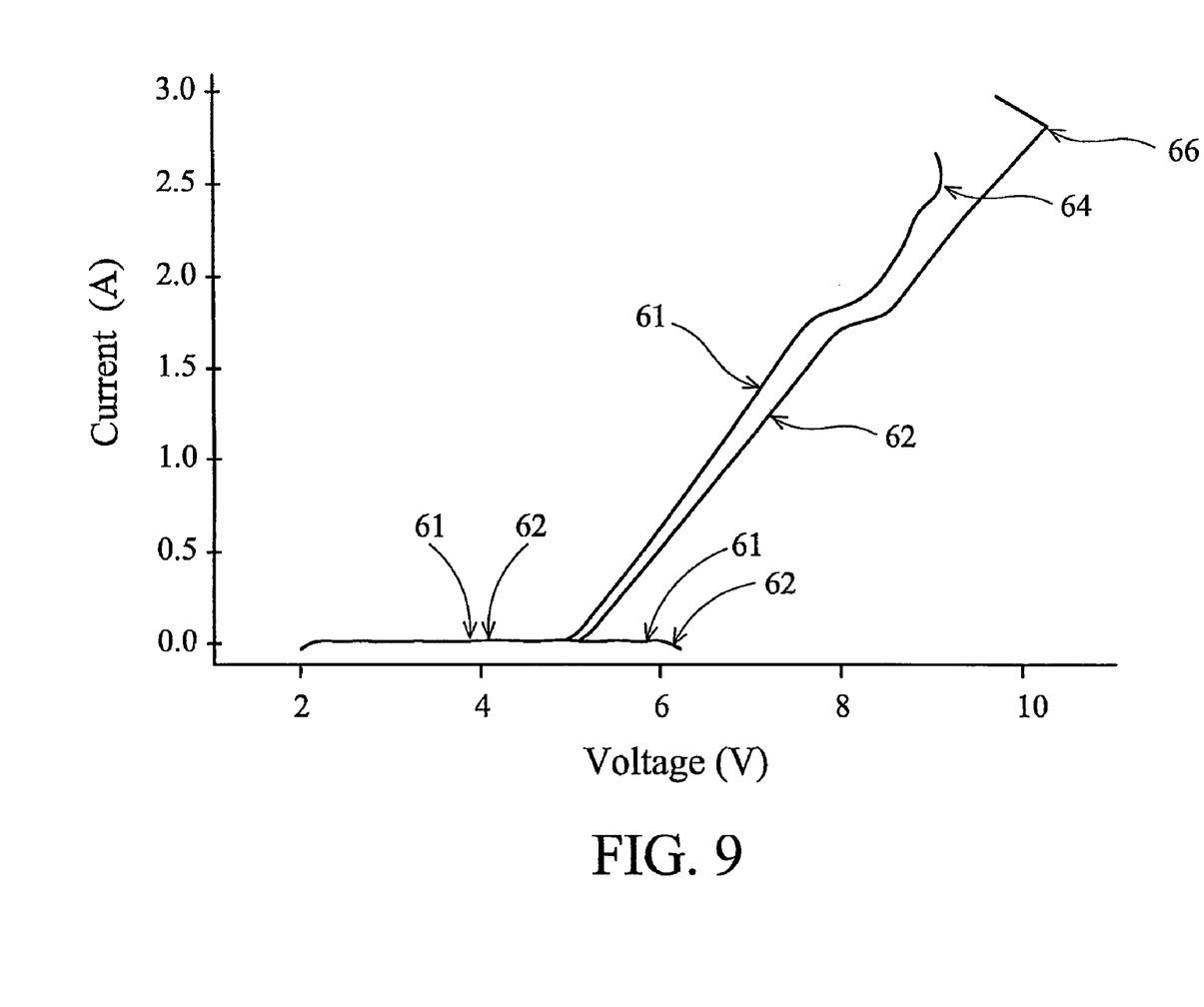
FIG. 9 shows the current in a GGNMOS as a function of the voltage applied.

The improvement of the preferred embodiment of the present invention is illustrated in FIG. 9. FIG. 9 shows the current in a GGNMOS as a function of the voltage applied. Line 61 is the test result of a conventional GGNMOS and line 62 is the test result of the preferred embodiment. Both tests are conducted on the GGNMOSs made with 0.13 µm technology. The conventional GGNMOS has a break down voltage at point 64, or 2.65A, while the preferred embodiment of the present invention has a break down voltage at point 66, or 2.90A. The results are shown in table 1.

TABLE 1

|  | IT2 | +HBM | +MM |
| --- | --- | --- | --- |
| Prior Art | 2.65 A | 2.5 kV | 100 V |
| Present Invention | 2.9 A | 4.0 kV | 225 V |

It is noted that besides the IT2 breakdown voltage improvement, the highest voltage sustained is also improved significantly. In human body mode (HBM), the highest voltage is increased to 4.0 kV for the present invention from 2.5 kV for the conventional GGNMOS. In machine mode (MM), the highest voltage is increased to 225 V for the present invention from 100 V for the conventional GGNMOS.

The present invention provides a novel structure and method to improve the uniformity of a GGNMOS. By making the sub transistors turn on more uniformly, the ESD protection circuit is made more efficient. This in turn improves the breakdown current and voltages, and the GGNMOS can be made smaller therefore saving layout space without sacrificing protection ability.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure for electrostatic discharge protection comprising:
    a substrate;
    a gate electrode;
    a first source/drain region and a second source/drain region adjacent respective sides of the gate electrode;
    contact plugs electrically coupled to the first source/drain region and the second source/drain region;
    metal lines electrically coupled to the contact plugs, wherein the metal lines are in a first metallization layer over the contact plugs and are located in a plane that is substantially parallel to a major surface of the substrate;
    a plurality of first level openings over and electrically coupled to the metal lines, at least one first level opening electrically coupled to the first source/drain region and at least one first level opening coupled to the second source/drain region;
    wherein the at least one first level opening electrically coupled to the first source/drain region is offset from lines running parallel to the major surface of the substrate and extending from each first level opening electrically coupled to the second source/drain region and substantially parallel to the flow of current between the first source/drain region and the second source/drain region; and
    wherein the first level openings are filled with conductive materials.

2. The semiconductor structure of claim 1 wherein the plurality of first level openings comprises at least two first level openings on the first source/drain region.

3. The semiconductor structure of claim 1 wherein the plurality of first level openings has a width between about 0.05 µm to about 0.5 µm.

4. The semiconductor structure of claim 1 further comprising a p-well pick-up region coupled between the gate electrode and a ground potential.

5. The semiconductor structure of claim 1 further comprising an n-well pick-up region coupled between the gate electrode and a ground potential.

6. The semiconductor structure of claim 1 wherein the gate electrode is coupled to ground potentials through pick-up regions at two ends.

7. The semiconductor structure of claim 1 wherein the gate electrode has a gate length of about 0.06 µm to about 0.4 µm.

8. The semiconductor structure of claim 1 wherein the gate electrode has a gate width of about 1 µm to about 90 µm.

9. The semiconductor structure of claim 8 wherein the gate electrode has a gate width of about 10 µm to about 60 µm.

10. The semiconductor structure of claim 1 further comprising a plurality of second level openings electrically coupled to the plurality of first level openings electrically coupled to the second source/drain region through a common conductor wherein the plurality of first level openings electrically coupled to the second source/drain region and the plurality of second level openings electrically coupled to the second source/drain region have a substantially asymmetrical layout, and wherein the second level openings are via openings filled with conductive materials.

11. The semiconductor structure of claim 10 wherein the second level openings have a width of between about 0.05 µm and about 0.5 µm.

12. The semiconductor structure of claim 10 wherein the second level openings comprise at least three second level openings electrically coupled to the second source/drain region.

13. The semiconductor structure of claim 1 wherein the first level openings have a substantially different pattern and spacing in the first source/drain region from the first level openings in the second source/drain region.

14. The semiconductor structure of claim 1 wherein the first source/drain region and second source/drain region are within an active region in the substrate.

15. The semiconductor structure of claim 14 wherein the active region has a length of about 1 µm to 10 µm.

16. The semiconductor structure of claim 15 wherein the active region has a length of about 1 µm to 3 µm.

17. The semiconductor structure of claim 14 wherein the active region has a width of about 10 µm to 100 µm.

18. The semiconductor structure of claim 17 wherein the active region has a width of about 10 µm to 30 µm.

19. A semiconductor structure for electrostatic discharge protection comprising:
    a substrate;
    a gate electrode;
    a first source/drain region and a second source/drain region adjacent respective sides of the gate electrode;
    a channel region between the first source/drain region and the second source/drain region, the channel region having a channel length measured from the first source/drain region to the second source/drain region;
    contact plugs electrically coupled to the first source/drain region and the second source/drain region;
    metal lines electrically coupled to the contact plugs, wherein the metal lines are in a first metallization layer over the contact plugs and wherein at least a portion of each metal line is located the same distance from the substrate;
    a plurality of first level openings over and electrically coupled to the metal lines, wherein a line running parallel with a major surface of the substrate, extending from a first opening connected to the first source/drain region and substantially parallel to the channel length does not intersect openings connected to the second source/drain region;
    wherein the plurality of first level openings are via openings comprising at least three first level openings electrically coupled to the second source/drain region; and
    wherein the first level openings are filled with conductive materials.

20. The semiconductor structure of claim 19 wherein the plurality of first level openings comprises at least two first level openings connected to the first source/drain region.

21. The semiconductor structure of claim 19 wherein the plurality of first level openings have a width of between about 0.05 µm and about 0.5 µm.

22. The semiconductor structure of claim 19 wherein the gate electrode is electrically coupled to ground potentials through pick-up regions.

23. The semiconductor structure of claim 19 wherein the gate electrode is coupled to ground potentials through pick-up regions at two ends.

24. The semiconductor structure of claim 19 further comprising a plurality of second level openings electrically coupled to the first level openings through a common metal line electrically connected to the second source/drain region wherein the second level openings are via openings filled with conductive materials, and wherein the first level openings and the second level openings connected to the second source/drain region have a substantially asymmetrical layout.

25. The semiconductor structure of claim 24 wherein the plurality of second level openings have a width of between about 0.05 µm and about 0.5 µm.

26. The semiconductor structure of claim 24 wherein the plurality of second level openings comprises at least three second level openings connected to the second source/drain region.

27. The semiconductor structure of claim 24 wherein the first level openings have a substantially different pattern and spacing from the second level openings in the second source/drain region.

28. A semiconductor structure for electrostatic discharge protection comprising:
   a substrate;
   a dielectric on the substrate;
   a gate electrode on the dielectric;
   a first source/drain region and a second source/drain region adjacent respective sides of the gate electrode wherein the first source/drain region and the second source/drain region each have a first end and a second end;
   a first plurality of contact plugs coupled to the second source/drain region;
   a second plurality of contact plugs coupled to the first source/drain region;
   a first level metal coupled to the first plurality of contact plugs, the first level metal being in a first metallization layer over the first plurality of contact plugs;
   a first group of first level vias electrically coupled to the second source/drain region coupled to the first level metal wherein the first group of first level vias comprises one or more vias and is over the first level metal;
   a second metal over and coupled to the second plurality of contact plugs and to a ground potential, the second metal being in the first metallization layer and separated from the first level metal in a direction parallel to a major surface of the substrate; and
   a second group of first level vias electrically coupled to the first source/drain region and over and coupled to the second metal wherein the second group of first level vias comprises one or more vias and wherein at least one of the second group of first level vias is offset from lines extending from vias of the first group of first level vias, crossing the gate electrode at substantially a right angle and running parallel with the major surface of the substrate.

29. The semiconductor structure of claim 28 wherein the first group of first level vias is at the first end of the second source/drain region and the second group of first level vias is at the second end of the first source/drain region.

30. The semiconductor structure of claim 28 further comprising a third group of first level vias wherein the first group of first level vias is at the first end of the second source/drain region, and the third group of first level vias is at the second end of the second source/drain region and substantially no via is at the middle of the second source/drain region, and wherein the second group of first level vias is at the middle of the first source/drain region and substantially no vias are at the ends of the first source/drain region.

31. The semiconductor structure of claim 30 further comprising:
   a third level metal coupled to the first group of first level vias and the third group of the first level vias; and
   a group of second level vias coupled to the second level metal wherein the group of second level vias comprises one or more vias.

32. The semiconductor structure of claim 28 wherein the second group of first level vias is coupled to a doped-well region wherein the doped-well region is selected from a group consisting of a p-well pick-up region and an n-well pick-up region.

33. The semiconductor structure of claim 32 wherein the doped-well region is grounded.

* * * * *